United States Patent [19]

Mizutani

[11] 4,396,930
[45] Aug. 2, 1983

[54] COMPACT MOSFET DEVICE WITH REDUCED PLURALITY OF WIRE CONTACTS

[75] Inventor: Yoshihisa Mizutani, Tokyo, Japan

[73] Assignee: Tokyo Shibaura Denki Kabushiki Kaisha, Kawasaki, Japan

[21] Appl. No.: 175,722

[22] Filed: Aug. 6, 1980

[30] Foreign Application Priority Data

Aug. 10, 1979 [JP] Japan .................. 54/101192

[51] Int. Cl.³ .................. H01L 29/06; H01L 29/78; H01L 27/02; H01L 29/04
[52] U.S. Cl. .................. 357/23; 357/20; 357/41; 357/59
[58] Field of Search ....... 357/23 MG, 23 TF, 23 GP, 357/23 S, 20, 4, 41, 14, 86, 23 R, 59

[56] References Cited
PUBLICATIONS

A. K. Malhotra and G. W. Neudeck, "Field-effect conductance change in amorphous silicon", *Applied Physics Letters*, vol. 24, No. 11 (1974) pp. 557–559.

*Primary Examiner*—James W. Davie
*Assistant Examiner*—J. Carroll
*Attorney, Agent, or Firm*—Finnegan, Henderson, Farabow, Garrett & Dunner

[57] ABSTRACT

A semiconductor device and a method for manufacturing the same are disclosed wherein an insulating thin film is formed on the surface of a semiconductor substrate, a gate electrode region of conductivity type different from that of the semiconductor substrate is selectively formed within the substrate and contiguous with the surface of the substrate, and source and drain regions are formed at the upper portion of the insulating thin film so that the voltage applied to the gate electrode region is below the reverse-breakdown voltage across a PN junction between the semiconductor substrate and the gate electrode region and determines the electrical conductivity of the source and drain regions.

4 Claims, 20 Drawing Figures

COMPACT MOSFET DEVICE WITH REDUCED PLURALITY OF WIRE CONTACTS

BACKGROUND OF THE INVENTION

The present invention relates to an improved MOS semiconductor device and a manufacturing method thereof.

Recently, semiconductor elements are becoming smaller and semiconductor devices are being packed with higher density. One of the factors which interferes with the higher packing density of the semiconductor devices is the problem of wiring between elements. In the case of a circuit which combines more than one transistor for controlling the electrical characteristics of a second transistor by utilizing the output voltage of a first transistor as a gate voltage to the second transistor, it has been required, as shown in FIG. 1, to form a contact hole 111a in a source region 103 or a drain region 104 of a first transistor $Q_1$ (this transistor comprising a gate electrode 101, the source region 103, the drain region 104, a gate electrode wiring part 107 and a source electrode 108, with numeral 111 denoting a contact hole); to form a contact hole 111b at a gate electrode 102 side of a second transistor $Q_2$ (this transistor comprising a gate electrode 102, a source region 105, a drain region 106, a source electrode 109 and a drain electrode 110, with numeral 111 denoting a contact hole); and to supply a voltage to the gate electrode 102 of the second transistor $Q_2$ using a suitable wiring material 120 such as Al. Accordingly, it was necessary in each region to secure a space in the contact hole for obtaining good ohmic contact, to secure a space for these regions and the Al wiring, and to consider the breaking of the wiring in places such as at the end of the contact hole.

SUMMARY OF THE INVENTION

The primary objects of the present invention are, therefore to provide a semiconductor device and a method for manufacturing the same wherein a high packing density may be attained, the manufacturing process may be made simpler, and the reliability of the element characteristics may be improved.

To the above and other ends, the present invention provides a semiconductor device comprising active elements which in turn comprise a semiconductor substrate of a first conductivity type, an insulating thin film formed over the surface of said semiconductor substrate, a second conductivity type region selectively formed within the substrate and contiguous with the surface of said semiconductor substrate, and a semiconductor layer formed over said second conductivity type region with said insulating thin film interposed therebetween so as to allow said semiconductor layer to at least partially overlap said second conductivity type region so that the electrical conductivity of said semiconductor layer is determined by a voltage applied to said second conductivity type region, the voltage being, below the reverse-breakdown voltage across a PN junction between said semiconductor substrate and said second conductivity type region.

The present invention, in another aspect, provides a method for manufacturing a semiconductor device comprising the steps of forming an insulating thin film over the surface of a semiconductor substrate of a first conductivity type and selectively forming a second conductivity type region between the surface of said semiconductor substrate and said insulating thin film, forming a semiconductor layer over said second conductivity type region with said insulating thin film interposed therebetween so as to allow said semiconductor layer to at least partially overlap said second conductivity type region, removing parts of said semiconductor layer other than the element region or converting said parts into an insulating layer, and introducing an impurity into said semiconductor layer so that electrical characteristics of said semiconductor layer are determined by a voltage applied to said second conductivity type region which is below the reverse-breakdown voltage across a PN junction between said semiconductor substrate and said second conductivity type region.

The present invention, in still another aspect, provides a method for manufacturing a semiconductor device comprising the steps of ion implanting oxygen or nitrogen ions in a semiconductor substrate so as to divide said semiconductor substrate into two layers by an insulating layer formed by the activating effects of the implanted ions, selectively ions implanting an impurity at parts corresponding to the surface of said semiconductor body below said insulating layer before or after the preceding step, removing unnecessary parts of said semiconductor layer on said insulating layer or converting said parts into an insulating layer, and introducing an impurity into said semiconductor layer on said insulating layer before or after the preceding step so that the electrical characteristics of said semiconductor layer are determined by a voltage applied to said second conductivity type region, the voltage being below the reverse-breakdown voltage across a PN junction between said semiconductor substrate and said second conductivity type region.

DETAILED DESCRIPTION OF THE PREFERRED EMBODIMENTS

The semiconductor device and its method of manufacture according to the present invention will now be described in more detail based on embodiments applied to N-channel transistors using silicon substrates.

Figure 3A:
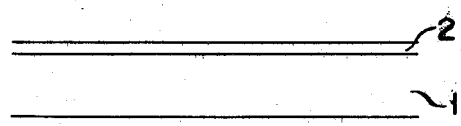
FIG. 3a and 3f are sectional views illustrating, in sequence, a method for manufacturing a semiconductor device of an embodiment of the present invention.
Figure 3B:
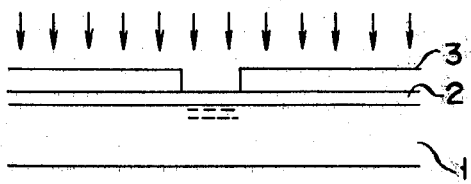

A silicon oxide film 2 is grown to a thickness of 700 Å by thermal oxidation on the surface of a silicon substrate 1 of P-type conductivity (FIG. 3a). Using a resist film 3 as a mask partially formed thereover, arsenic ions are doped in the amount of $2 \times 10^{15}/cm^2$ at an accelerating voltage of 180 KeV by ion implantation (FIG. 3b). The ion implanted arsenic ions penetrate through the silicon oxide film 2 and reach just inside this silicon oxide film 2. Thereafter, they are activated by a suitable heat treatment and form a diffusion layer 4 of N-type conductivity which is contiguous with the silicon oxide film (FIG. 3c).

Figure 3C:
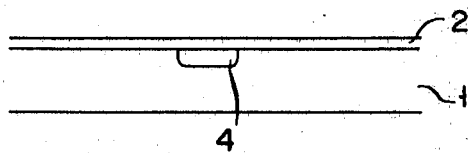

A structure similar to that shown in FIG. 3c may alternatively be obtained by selectively forming in advance an N-type conductivity diffusion layer 4 on the surface of a silicon substrate by ion implantation or by thermal diffusion and thereafter oxidizing the entire surface. Still alternatively, an N-type impurity pattern may be formed on a substrate and thermally oxidized. Then the resist film 3 is removed and a polycrystalline silicon film 5 is formed on the entire surface by the CVD method.

Figure 3D:
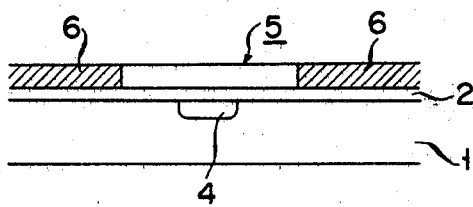

Unnecessary parts 6 of the polycrystalline silicon film 5 are removed by selective etching so that only the part necessary for mounting elements is left. These parts 6 may alternatively be converted into an insulating material by any method such as the selective oxidation. This method will be described below. If necessary, the threshold voltage is adjusted by channel doping (FIG. 3d).

Figure 3E:
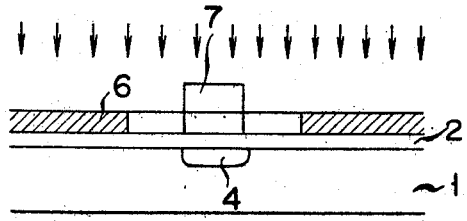
Figure 3F:
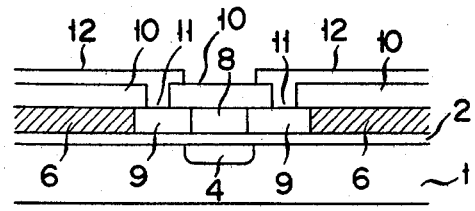

A resist film 7 is partially formed over the diffusion layer 4. Using this as a mask, arsenic ions are doped in the amount of $2 \times 10^{15}/cm^2$ at an accelerating voltage of 200 KeV (FIG. 3e). The doped arsenic ions are activated by a suitable heat treatment to follow and form N-type source and drain regions 9. After removing the resist film 7, a silicon oxide film 10 of 1 μm in thickness is formed on the entire surface by the CVD method. A contact hole is formed, and Al deposition patterning is performed so as to form source and drain contacts 11 and 12, respectively (FIG. 3f).

Although the source and drain contacts 11 and 12 were formed as connections to the source and drain, the source and drain regions 9 themselves may simply be extended so as to the processing involved in the formation of separate source and drain contacts. Similarly, the impurity layer of the diffusion layer gate electrode 4 may be extended so as to eliminate the formation of a separate contact for the gate.

In a MOS transistor obtained with such a method, the N-type diffusion layer 4 formed in the P-type silicon substrate may be used as a gate electrode for controlling the electrical characteristics of the transistor. That is, the gate voltage applied for controlling the electrical conductivity of the N-channel transistor is positive with respect to the source potential. Generally, the potential of the silicon substrate 1 is set to be common with the source potential so that a positive voltage applied to the gate electrode 4 is held by the reverse-breakdown voltage induced between the silicon substrate 1 and the diffusion gate electrode 4. Further, with a transistor of such a construction, since the gate electrode is embedded in the silicon substrate and a polycrystalline silicon film constituting an element mounting part covers thereover, the transistor is significantly resistant to contamination introduced externally to the gate electrode after formation of elements. Thus, the reliability of the element characteristics is improved.

Further, since separate electrode contacts for the source, drain and gate electrodes need not be formed, the steps of Al deposition for flattening the elements and of patterning may be eliminated.

Figure 4A:
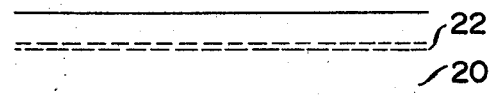
FIGS. 4a to 4c are sectional views illustrating, in sequence, a method for manufacturing a semiconductor device of another embodiment of the present invention.

The semiconductor element of the construction according to the present invention may alternatively be manufactured by the following steps. Oxygen or nitrogen ions are ion implanted in a P-type silicon substrate 20 (FIG. 4a). The ion implanted oxygen or nitrogen is activated by a subsequent heat treatment. Then an embedded insulating layer 22 is formed in the silicon substrate and the silicon substrate is divided into a part 21 at the substrate side and a part 25 at the surface side.

Figure 4B:
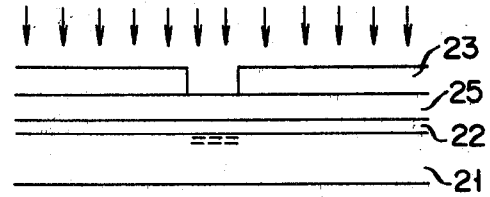
Figure 4C:
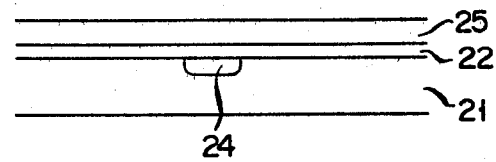

Using as a mask a resist film 23 selectively formed thereover, an impurity for rendering N-type conductivity, such as phosphorus or arsenic, is ion implanted. The accelerating voltage is selected so that the ion implanted layer is slightly closer to the substrate than the insulating layer 22 (FIG. 4b). The impurity ions which are ion implanted are activated by a suitable heat treatment to follow and form an N-type diffusion layer 24 contiguous with the insulating layer 22.

Thereafter, the steps previously described (FIGS. 3d–3f) are performed so as to obtain a semiconductor element of the construction according to the present invention.

Figure 5A:
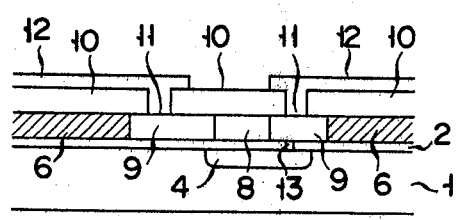
FIGS. 5a and 5b are sectional view and a equivalent circuit diagram, respectively, of a semiconductor device of still another embodiment of the present invention.
Figure 5B:
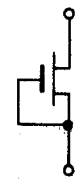

The silicon layer 25 at the surface side may be made thicker during this process by a method such as the epitaxial growing method or the CVD method. Although the present invention has been described as applied to an N-channel transistor in this embodiment, it is to be understood that a P-channel transistor may be manufactured starting from an N-type silicon substrate. The semiconductor substrate may be made of germanium, GaAs or the like instead of silicon. Further, as shown in FIGS. 5a and 5b, the N-type diffusion layer 4 embedded in the silicon substrate 1 may be extended to the lower side of the source or drain region 9. Then a contact hole 13 is formed in the part of the silicon oxide film 2 adjacent to the extended part for direct connection with the source or drain region 9.

Figure 6:
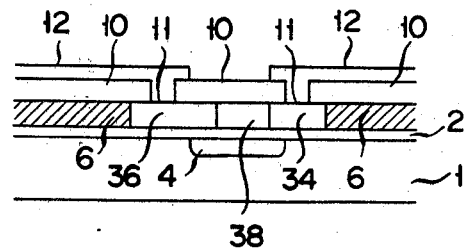
FIG. 6 is a sectional view illustrating a gate-controlled diode according to the present invention.

FIG. 6 is a sectional view of an example of a gate-controlled diode which applies the structure of the present invention. The gate-controlled diode of this type is an effective element, especially for a protective circuit for eliminating damage to the gate due to excessive voltage noise of the input and output circuits. Numerals 1, 2, 4, 6, 10–12 in this figure denote similar parts as designated by the same numerals in FIG. 1. Numeral 34 denotes N+ region; 38, P region; and 36, P+ region.

The semiconductor element of the structure of the present invention shows particularly advantageous effects when combined, for constituting an electronic circuit, with conventional semiconductor elements of conventional structure, such as an MOS transistor wherein source and drain regions are formed on the semiconductor substrate side and a gate electrode is formed on the channel region between these two regions through an insulating film.

Figure 7A:
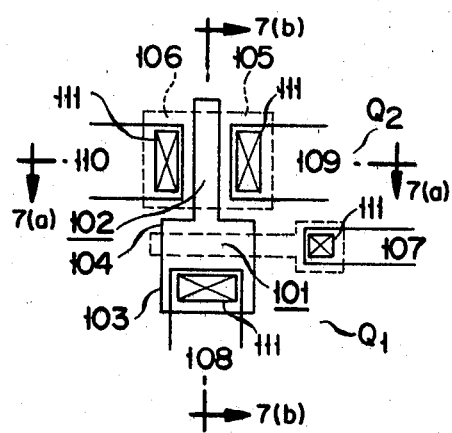
FIG. 7(a) is a plan view of a semiconductor device of the present invention which constitutes a circuit by combining two transistors.

FIG. 7(a) shows a case in which the transistor $Q_1$ of the conventional semiconductor device shown in FIG.

Figure 1:
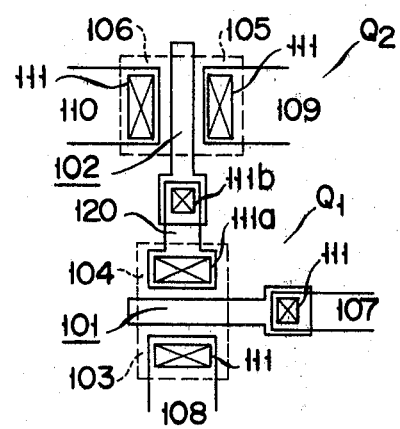
FIG. 1 is a plan view of a conventional semiconductor device which constitutes a circuit by combining two transistors.
Figure 2:
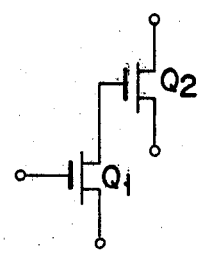
FIG. 2 is an equivalent circuit diagram of the semiconductor device of FIG. 1.

1 is replaced with a transistor of the structure of the present invention. In FIG. 7(a), the gate electrode 102 of the transistor Q₂ comprises the drain region 104 of the transistor Q₁ and an integrally formed semiconductor layer. Thus, the contact holes 111a and 111b shown in FIG. 1 are not required, thus eliminating the problem of breakage of the wiring and improving the packing density. The area shared by the transistors Q₁ and Q₂ is decreased by 35% in the case of FIG. 7(a) in comparison with the case of FIG. 1.

Figure 7B:
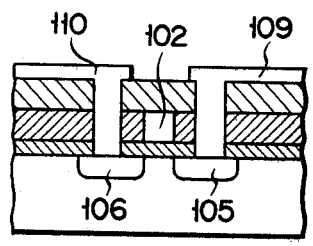
FIG. 7(b) is a cross sectional view of FIG. 7(a) taken along the line 7(a)—7(a)
Figure 7C:
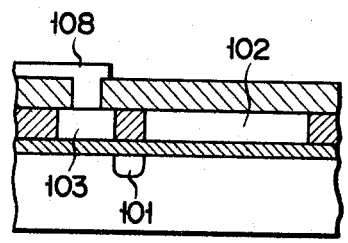
FIG. 7(c) is a cross sectional view of FIG. 7(a) taken along the line 7(b)—7(b)

FIGS. 7(b) and 7(c) are cross-sectional views of FIG. 7(a) taken along the lines 7(a)—7(a) and 7(b)—7(b), respectively. Like elements in FIGS. 7(a), 7(b), and 7(c) are identified by the same reference numerals.

Figure 8A:
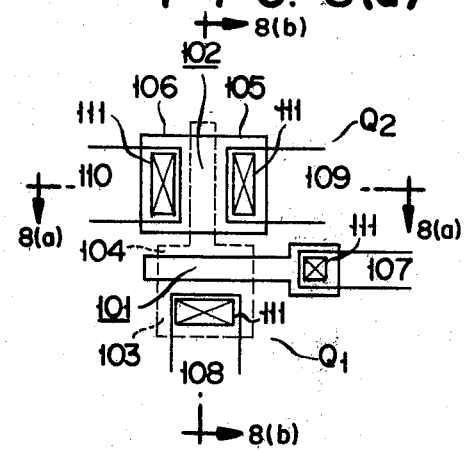
FIG. 8(a) is a plan view of a semiconductor device of still another embodiment of the present invention which constitutes a circuit by combining two transistors.

In FIG. 8(a), contrary to the case of FIG. 7(a), the transistor Q₂ is replaced with a transistor of the structure of the present invention. The decrease in the area realized is also 35%. The same numerals denote the same parts in FIGS. 1, 7(a) and 8(a).

Figure 8B:
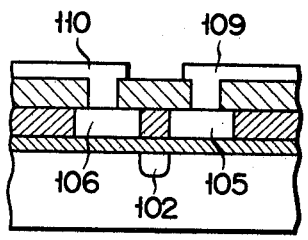
FIG. 8(b) is a cross sectional view of FIG. 8(a) taken along the line 8(a)—8(a)
Figure 8C:
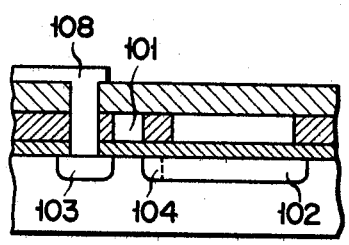
FIG. 8(c) is a cross sectional view of FIG. 8(a) taken along the line 8(b)—8(b).

FIGS. 8(b) and 8(c) are cross-sectional views of FIGS. 8(a) taken along the lines 8(a)—8(a) and 8(b)—8(b), respectively. Like elements in FIGS. 8(a), 8(b), and 8(c) are identified by the same reference numerals.

In summary, in accordance with the present invention, since the gate electrode part can be embedded inside the semiconductor substrate, the patterning of the electrode lead can be vastly decreased so that the packing density of the semiconductor devices may be greatly improved, problems such as external contamination and breakage of the electrode lead may be eliminated, and the reliability of the element characteristics of the semiconductor device may be significantly improved.

What is claimed is:

1. A semiconductor device comprising active elements which in turn comprise:
    a semiconductor substrate of a first conductivity type having at least one surface,
    an insulating thin film formed over the surface of said semiconductor substrate.
    a second conductivity type region selectively formed within said substrate and having a surface contiguous with at least a portion of the surface of said substrate, wherein said second conductivity type region is a gate, and
    a semiconductor layer formed over said second conductivity type region with said insulating thin film interposed between said semiconductor layer and said second conductivity type region to allow said semiconductor layer to at least partially overlap said second conductivity type region,
    a source region and a drain region formed in said semiconductor layer contiguous with the surface of said insulating thin film, the electrical conductivity of said semiconductor layer between said source and drain regions being effected by a voltage applied to said second conductivity region, said voltage being below the reverse-breakdown voltage across a PN junction formed by said semiconductor substrate and said second conductivity type region.

2. A semiconductor device as claimed in claim 1 wherein said gate region and said source region or said drain region are electrically connected through a contact hole formed in said insulating thin film.

3. A semiconductor device comprising a first transistor having active elements which in turn comprise:
    a semiconductor substrate of a first conductivity type having at least one surface,
    an insulating thin film over the surface of said semiconductor substrate,
    a gate region of a second conductivity type within said substrate and having a surface contiguous with at least a portion of the surface of said substrate,
    a semiconductor layer over the insulating thin film, and
    a source region and a drain region formed in said semiconductor layer over said gate region with said insulating thin film interposed between said source and drain regions and said gate region to allow said source and drain regions to at least partially overlap said gate region; and
    a second transistor having active elements which in turn comprise:
    a source or drain region in the surface of said semiconductor substrate, and
    a gate region formed in said semiconductor layer above said insulating thin film of said first transistor;
    wherein the gate of one of said first and second transistors and at least one of the source or drain regions of the other of the first and second transistors are formed integrally with each other.

4. A semiconductor device comprising a first transistor having active elements which in turn comprise:
    a semiconductor substrate of a first conductivity type having at least one surface,
    an insulating thin film over the surface of said semiconductor substrate,
    a semiconductor layer over the insulating thin film,
    a gate region of a second conductivity type within said substrate and contiguous with the surface of said substrate, and
    a source region and a drain region formed in said semiconductor layer over said gate region with said insulating thin film interposed between said source and drain regions and said gate region to allow said source and drain regions to at least partially overlap said gate region; and
    a second transistor having active elements which in turn comprise:
    source and drain regions in the surface of said semiconductor substrate, and
    a gate in said semiconductor layer over said insulating thin film of said first transistor;
    when the gate of one of said first and second transistors and at least one of the source and drain regions of the other of the first and second transistors are formed integrally with each other.

* * * * *